(12) United States Patent
Kubo et al.

(10) Patent No.: US 8,709,860 B2
(45) Date of Patent: Apr. 29, 2014

(54) METHOD FOR MANUFACTURING PHOTOELECTRIC CONVERSION DEVICE

(75) Inventors: Shintaro Kubo, Higashiomi-shi (JP);
Rui Kamada, Higashiomi-shi (JP);
Yusuke Miyamichi, Hikone-shi (JP);
Shuji Nakazawa, Gyeonggi-do (KR)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 13/640,526

(22) PCT Filed: Apr. 12, 2011

(86) PCT No.: PCT/JP2011/059066
§ 371 (c)(1),
(2), (4) Date: Oct. 11, 2012

(87) PCT Pub. No.: WO2011/129322
PCT Pub. Date: Oct. 20, 2011

(65) Prior Publication Data
US 2013/0026588 A1  Jan. 31, 2013

(30) Foreign Application Priority Data
Apr. 14, 2010 (JP) ................................ 2010-093246

(51) Int. Cl.
*H01L 21/00* (2006.01)
*H01L 31/032* (2006.01)
*H01L 21/02* (2006.01)
H01L 31/0749 (2012.01)
H01L 31/18 (2006.01)

(52) U.S. Cl.
CPC ........... *H01L 31/0322* (2013.01); *Y02E 10/541* (2013.01); *H01L 31/0749* (2013.01); *H01L 21/02628* (2013.01); *H01L 31/18* (2013.01)
USPC .............. 438/95; 438/87; 257/431; 136/255; 427/76

(58) Field of Classification Search
CPC ................. H01L 31/02628; H01L 31/0322; H01L 31/0749; H01L 31/18; Y02E 10/541
USPC ................. 257/21, 431, E31.004, E31.033; 438/95; 136/255, 256; 427/74, 383.1
See application file for complete search history.

(56) References Cited

U.S. PATENT DOCUMENTS 4,684,761 A * 8/1987 Devaney ................. 136/258
5,141,564 A * 8/1992 Chen et al. ............. 136/258
(Continued)

FOREIGN PATENT DOCUMENTS

| JP | 2007-311578 A | 11/2007 |
| JP | 2009-170867 A | 7/2009 |
| JP | 2009-267335 A | 11/2009 |

OTHER PUBLICATIONS

Nomura, R, Kanaya, K, and Matsuda, H, Preparation of copper-indium-sulfide thin films by solution pyrolysis of organometallic sources, Chem. Lett., 1988. (1849-50).*

(Continued)

*Primary Examiner* — Allen Parker
*Assistant Examiner* — Gardener W Swan
(74) *Attorney, Agent, or Firm* — Procopio, Cory, Hargreaves & Savitch LLP

(57) ABSTRACT

The object is to improve the conversion efficiency of a photoelectric conversion device. This object can be achieved by a photoelectric conversion device including an electrode and a semiconductor layer which is provided on one main surface of the electrode and contains a I-III-VI group compound semiconductor, wherein the semiconductor layer includes a connection layer that is located at a position on the one main surface side of the electrode and has a tendency that, the closer to the one main surface, the greater a quotient obtained by dividing an amount of substance of a I-B group element by an amount of substance of a III-B group element becomes.

1 Claim, 5 Drawing Sheets

(56) References Cited

U.S. PATENT DOCUMENTS

| | | |
|---|---|---|
| 6,992,202 B1 * | 1/2006 | Banger et al. .................. 556/28 |
| 2009/0233398 A1 * | 9/2009 | Fox et al. ....................... 438/95 |
| 2010/0229936 A1 | 9/2010 | Yago et al. |

OTHER PUBLICATIONS

International Preliminary Report on Patentability and International Search Report issued for the International Application No. PCT/JP2011/059066.

* cited by examiner

F I G. 1 1
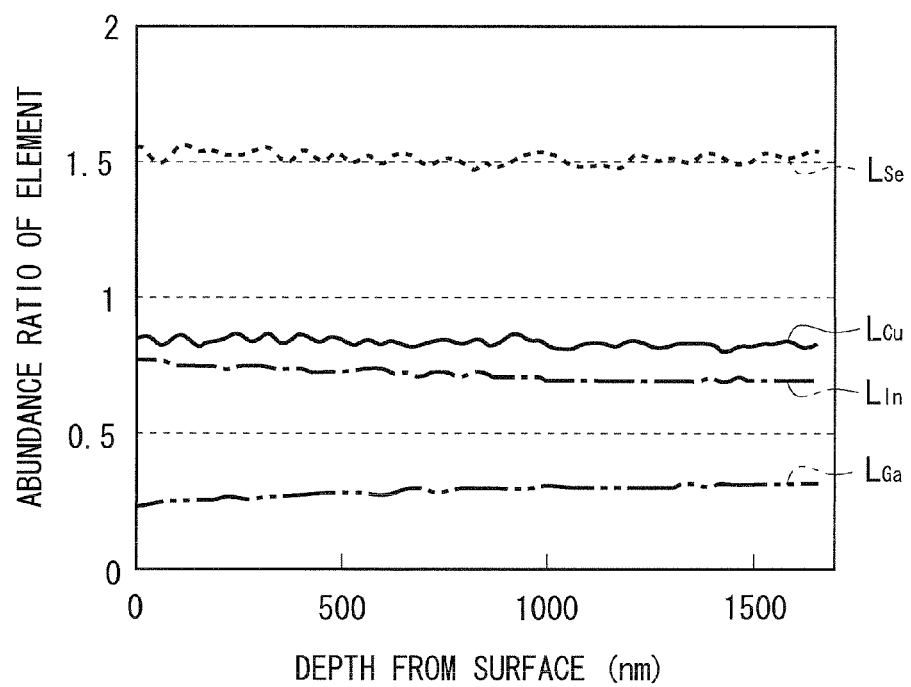

METHOD FOR MANUFACTURING PHOTOELECTRIC CONVERSION DEVICE

TECHNICAL FIELD

The present invention relates to a photoelectric conversion device and a method for manufacturing such a photoelectric conversion device.

BACKGROUND ART

As solar cells, those using a photoelectric conversion device provided with a light absorption layer mainly comprised of a I-III-VI group compound semiconductor have been proposed (for example, Japanese Patent Application Laid-Open No. 2007-311578). The I-III-VI group compound semiconductor is a chalcopyrite-based compound semiconductor using CIGS or the like. The CIGS has a high light absorption coefficient, and is suitably applied so as to provide a thinner 15 photoelectric conversion device with a large area and reduce manufacturing costs thereof.

In the photoelectric conversion device, a plurality of photoelectric conversion cells are arranged side by side on a plane. In each of the photoelectric conversion cells, a lower electrode mainly comprised of a metal electrode or the like, a photoelectric conversion layer comprised of a semiconductor layer mainly including a light absorption layer, a buffer layer and the like, and an upper electrode mainly comprised of a transparent electrode, a metal electrode and the like are stacked on a substrate comprised of glass or the like, in this order. Moreover, the plural photoelectric conversion cells are electrically connected in series with one after another, with the upper electrode of one of adjacent photoelectric conversion cells being electrically connected to the lower electrode of the other photoelectric conversion cell by a connection conductor.

SUMMARY OF INVENTION

Problems to be Solved by the Invention

Problems to be Solved by the Invention

For the chalcopyrite-based photoelectric conversion devices, the improvement of conversion efficiency is always required.

Therefore, there have been strong demands for improving the conversion efficiency of the photoelectric conversion device.

Means for Solving the Problems

A photoelectric conversion device according to a first aspect is provided with: an electrode and a semiconductor layer that is formed on one main surface of the electrode, and contains a I-III-VI group compound semiconductor. Moreover, the semiconductor layer includes a connection layer that is located at a position on the one main surface side, and has such a tendency that, the closer to the one main surface, the greater a quotient obtained by dividing an amount of substance of a I-B group element by an amount of substance of a III-B group element becomes.

Furthermore, a method for manufacturing a photoelectric conversion device according to a second aspect is provided with: preparing a solution containing a Lewis base organic compound, an organic compound containing a chalcogen element, a I-B group element and a III-B group element; applying the solution onto one main surface of an electrode so as to form a coat containing the I-B group element and the III-B group element thereon; and heating the coat in a temperature range from 100° C. or more to 400° C. or less so as to form a semiconductor layer including a connection layer that is located on the one main surface side, and has a tendency that, the closer to the one main surface, the greater a quotient obtained by dividing an amount of substance of a I-B group element by an amount of substance of a III-B group element becomes, and containing a I-III-VI group compound semiconductor.

Effects of the Invention

In accordance with the aspects of the present invention, the existence of the connection layer makes it possible to improve the conversion efficiency of a photoelectric conversion device.

BRIEF DESCRIPTION OF DRAWINGS

FIG. 11 is a view that shows a relationship between a depth and an abundance ratio of an element in a light absorption layer of a comparative example.

EMBODIMENT FOR CARRYING OUT THE INVENTION

Figure 1:
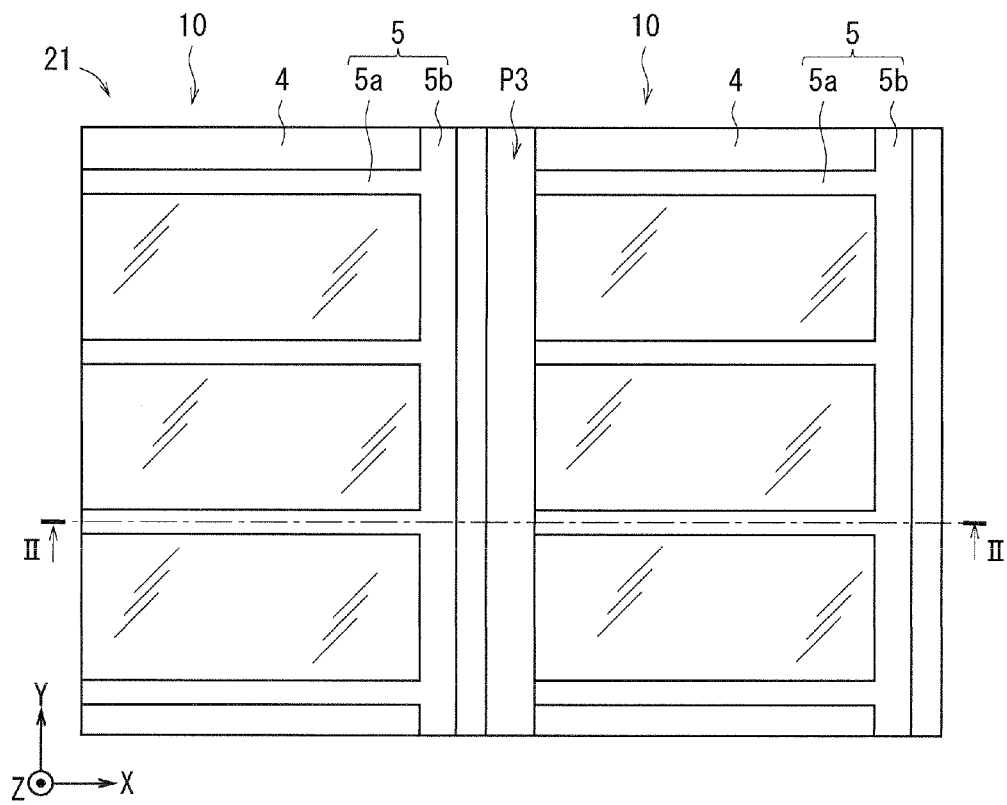
FIG. 1 is a schematic view showing a state in which a photoelectric conversion device in accordance with one embodiment is viewed from above.

Referring to drawings, the following description will discuss one embodiment of the present invention. In the drawings, those components having the same structure and functions are indicated by the same reference numerals, and in the following description, overlapped explanations will be omitted. Moreover, the drawings are schematically illustrated, and the size, positional relationship and the like of the various structures in the drawings are not precisely indicated. FIGS. 1 to 9 are each given a right-handed XYZ coordinate system where a direction along which photoelectric conversion cells 10 are arranged (crosswise direction in the view of the drawing in FIG. 1) is set to the X-axis direction.

(1) Structure of Photoelectric Conversion Device

A photoelectric conversion device 21 is provided with a substrate 1 and a plurality of photoelectric conversion cells 10 that are planarly arranged on the substrate 1. In FIG. 1, for convenience of drawing, only portions of two photoelectric cells 10 are illustrated. On an actual photoelectric conversion device 21, a large number of the photoelectric conversion cells 10 can be planarly arranged in a lateral direction in the drawing.

Each of the photoelectric conversion cells 10 is provided with a lower electrode layer 2, a photoelectric conversion layer 3, an upper electrode layer 4 and a grid electrode 5. In the photoelectric conversion device 21, a main surface on the side where the upper electrode layer 4 and the grid electrode 5 are disposed forms a light receiving surface. Moreover, first to third grooves P1, P2 and P3 are extended in the photoelectric conversion device 21.

The substrate 1 is used for supporting the plural photoelectric conversion cells 10. As a material to be used for the substrate 1, for example, glass, a ceramic material, a resin, metal, etc. can be proposed. In the present embodiment, the substrate 1 is comprised of a blue plate glass (soda-lime glass) having a thickness of 1 mm or more to 3 mm or less.

The lower electrode layer 2 is a conductive layer placed on a main surface (referred to also as one main surface) on the +Z side of the substrate 1. As a main material contained in the lower electrode layer 2, for example, various metals or the like having conductivity, such as Mo, Al, Ti, Ta or Au or the like, can be proposed. Further, it is sufficient that the thickness of the lower electrode layer 2 is set to about 0.2 μm or more to 1 μm or less. The lower electrode layer 2 can be formed by using a conventional thin-film forming method, such as, for example, a sputtering method or a vapor deposition method.

The photoelectric conversion layer 3 is provided with a light absorption layer 31 and a buffer layer 32. Moreover, in the photoelectric conversion layer 3, the light absorption layer 31 and the buffer layer 32 are laminated.

The light absorption layer 31 is disposed on a main surface (referred to also as one main surface) on the +Z side of the lower electrode layer 2, and contains a semiconductor having a first conductive type. In this case, the first conductive type is a p-type. The thickness of the light absorption layer 31 is set to, for example, about 1 μm or more to 3 μm or less. In the case when the light absorption layer 31 is a layer comprised of a group compound semiconductor, that is, a chalcopyrite-based (referred to also as CIS-based) compound semiconductor, the conversion efficiency can be enhanced even when the thickness of the light absorption layer 31 is thin. Thus, the light absorption layer 31 can be produced at low costs by using a small amount of the material. In the present embodiment, the light absorption layer 31 is a layer of the I-III-VI group compound semiconductor having the p-type conductivity.

The I-III-VI group compound semiconductor is a semiconductor mainly containing a I-III-VI group compound. Moreover, the semiconductor mainly containing a I-III-VI group compound means that the semiconductor contains 70 mol % or more of a I-III-VI group compound. In the following description also, the term "mainly contain(s)" means "contain(s) 70 mol % or more". The I-III-VI group compound is a compound mainly containing a I-B group element (referred to also as 11 group element), a III-B group element (referred to also as 13 group element), and a VI-B group element (referred to also as 16 group element). As the I-III-VI group compound, for example, $CuInSe_2$ (referred to also as CIS), $Cu(In, Ga)Se_2$ (referred to also GIGS), $Cu(In, Ga)(Se, S)_2$ (referred to also as CIGSS), etc. may be used. In this case, $Cu(In, Ga)Se_2$ is a compound mainly containing Cu, In, Ga and Se. Moreover, $Cu(In, Ga)(Se, S)_2$ is a compound mainly containing Cu, In, Ga, Se and S. Furthermore, the light absorption layer 31 may be a thin film of a multiple compound semiconductor comprised of $Cu(In, Ga)Se_2$ or the like on which a thin $Cu(In, Ga)(Se, S)_2$ layer is formed as a surface layer. In the present embodiment, the light absorption layer 31 mainly contains GIGS.

Figure 3:
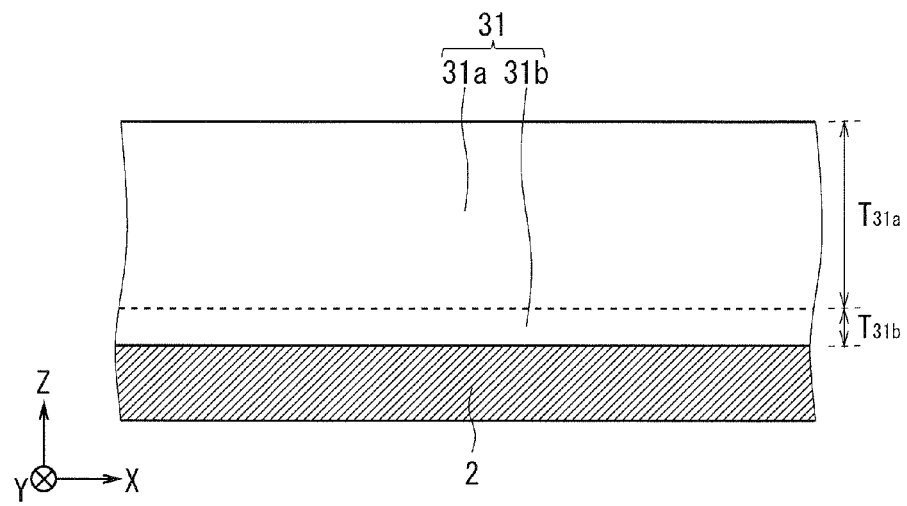
FIG. 3 is a schematic view showing the existence of a connection layer in a light absorption layer.

FIG. 3 is a schematic view illustrating a structure which focuses on the light absorption layer 31 and the lower electrode layer 2. The light absorption layer 31 is provided with a main layer 31a and a connection layer 31b.

The main layer 31a mainly contains GIGS. In this case, the main layer 31a corresponds to a portion on a buffer layer 32 side of the light absorption layer 31. The main layer 31a contains a I-B group element, a III-B group element and a VI-B group element that have a virtually constant ratio (composition ratio) in amounts of substances.

The connection layer 31b is formed between the main layer 31a and the lower electrode layer 2. That is, the connection layer 31b corresponds to a portion on one main surface side of the lower electrode layer 2 of the light absorption layer 31. The connection layer 31b connects the light absorption layer 31 and the lower electrode layer 2 with each other. Moreover, the connection layer 31b shows such a tendency that, as it comes closer to the main surface of the lower electrode layer 2, the quotient obtained by dividing an amount of substance of a I-B group element by an amount of substance of a III-B group element (referred to also as a I-III substance amount ratio) becomes greater. Additionally, the tendency that, as the layer comes closer to the main surface of the lower electrode layer 2, the I-III substance amount ratio is increased is not limited to the fact that the I-III substance amount ratio is kept increasing in a direction from the main layer 31a side toward the lower electrode layer 2 side, but is allowed to slightly increase or reduce in the middle of its increase. For example, the I-III substance amount ratio may be increased or reduced by about ±20% relative to the total amount of increase in the middle of its increase.

More specifically, the connection layer 31b mainly contains the I-III-VI group compound semiconductor, and also contains a compound (referred to also as a I-VI group compound) of a I-B group element and a VI-B group element. Moreover, the connection layer 31b shows a tendency that, as it comes closer to the one main surface of the lower electrode layer 2, the amount of content of the I-VI group compound becomes greater. More specifically, in the connection layer 31b, for example, $Cu_2Se$ or CuSe, which is a compound of Cu belonging to a I-B group element, and Se belonging to a VI-B group element, is present or a mixture of these is present. In this case, the connection layer 31b shows a tendency that, as it comes closer to the one main surface of the lower electrode layer 2, a proportion thereof occupied by the compound ($Cu_2Se$ and/or CuSe) of copper and selenium belonging to the I-VI group compound is increased.

The compound ($Cu_2Se$ and/or CuSe) of copper and selenium belonging to the I-VI group compound has an electric conductivity higher than that of CIGS belonging to a I-III-VI group compound semiconductor. For this reason, the connection layer 31b makes it possible to transmit a charge generated by photoelectric conversion in CIGS to the lower electrode layer 2 with high efficiency. Consequently, the conversion efficiency of the photoelectric conversion device 21 is improved.

Moreover, in the case when the connection layer 31b exists even if its amount is slight, the conversion efficiency of the photoelectric conversion device 21 can be improved. However, when the connection layer 31b has a certain degree of thickness, the improvement of the conversion efficiency by the existence of the connection layer 31b can be clearly achieved. On the other hand, as the thickness of the main layer 31a becomes thicker, the photoelectric conversion in the main layer 31a can be accelerated. That is, as long as the ratio of thickness of the connection layer 31b to total thickness of the light absorption layer 31 is within a predetermined range, the conversion efficiency of the photoelectric conversion device 21 is improved, with the photoelectric conversion in the main layer 31a being accelerated.

More specifically, for example, with a direction normal to one of the main surface of the lower electrode layer 2 being set to the thickness direction of the main layer 31a and the connection layer 31b, suppose that the thickness of the main layer 31a is indicated by $T_{31a}$ and the thickness of the connection layer 31b is indicated by $T_{31b}$. At this time, it is sufficient that the following relationship is satisfied: $0.1 \leq T_{31b}/(T_{31a}+T_{31b}) \leq 0.5$. In this case, it is sufficient that the thicknesses $T_{31a}$ and $T_{31b}$ are given, for example, as an average value of the thickness of the main layer 31a and an average value of the thickness of the connection layer 31b, in the main layer 31a and the connection layer 31b that are stacked on the same region within the one main surface of the lower electrode layer 2. It is sufficient that the same region is a region having a predetermined area, with a specific shape, such as, for example, a rectangular shape, a square shape, or the like, when the one main surface of the lower electrode layer 2 is viewed as a plane from above (from the +Z side). It is sufficient that the predetermined area is, for example, an area in the order from several tens of $\mu m^2$ to several $cm^2$.

Moreover, the light absorption layer 31 can be formed by using a so-called coating method or printing method. In the coating method, after applying a solution (referred to also as a semiconductor forming solution) containing complexes of main constituent elements of the light absorption layer 31 onto the lower electrode layer 2, the resulting layer is subjected to a drying treatment so that a coat from which the solvent components have been removed is formed in a half-dried state. The coat is then subjected to a heating treatment.

The buffer layer 32 is a semiconductor layer formed on one main surface of the light absorption layer 31. The semiconductor layer has a conductive type that is different from the conductive type of the light absorption layer 31. In this case, the different conductive type is the n-type. Moreover, the buffer layer 32 and the light absorption layer 31 form a hetero-junction region. In a photoelectric conversion cell 10, photoelectric conversion is exerted in the photoelectric conversion layer 3 on which the light absorption layer 31 and the buffer layer 32 are stacked. Additionally, a semiconductor having a different conductive type refers to a semiconductor having conductive carriers (carriers) of a different type. In the case when the conductive type of the light absorption layer 31 is the p-type, the conductive type of the buffer layer 32 may be not the n-type but an i-type. Furthermore, in the case when the conductive type of the light absorption layer 31 is the n-type or the i-type, the conductive type of the buffer layer 32 may be the p-type.

The buffer layer 32 mainly contains a compound semiconductor. Examples of the compound semiconductor contained in the buffer layer 32 include: CdS, $In_2S_3$, ZnS, ZnO, $In_2Se_3$, In(OH, S), (Zn, In)(Se, OH), (Zn, Mg)O and the like. When the resistivity of the buffer layer 32 is $1\Omega \cdot cm$ or more, the leakage current can be reduced. Moreover, the buffer layer 32 may be formed by, for example, a chemical bath deposition (CBD) method.

Moreover, the thickness direction of the buffer layer 32 is virtually coincident with a direction (referred to also as a direction normal to the one main surface) perpendicular to the one main surface of the light absorption layer 31. It is sufficient that the thickness of the buffer layer 32 is, for example, set in a range from 10 nm or more to 200 nm or less. In the case when the thickness of the buffer layer 32 is from 100 nm or more to 200 nm or less, degradation of conversion efficiency under high-temperature and high-humidity conditions can be remarkably prevented.

The upper electrode layer 4 is formed on a main surface (referred to also as one main surface) on the +Z side of the buffer layer 32. The upper electrode layer 4 is, for example, a transparent conductive film having the conductive type of the n-type. The upper electrode layer 4 serves as an electrode for use in taking out a charge generated in the photoelectric conversion layer 3. Moreover, a material mainly contained in the upper electrode layer 4 has a resistivity lower than that of the buffer layer 32. The upper electrode layer 4 may include a so-called window layer, or may include the window layer and a transparent conductive film.

The upper electrode layer 4 mainly contains a transparent material having low resistance with a wide forbidden band width. Examples of such a material include: metal oxide semiconductors and the like, such as ZnO, $In_2O_3$ and $SnO_2$. Each of these metal oxide semiconductors may contain any of elements including Al, B, Ga, In, F and the like. Specific examples of these metal oxide semiconductors containing any of these elements include: AZO (Aluminum Zinc Oxide), GZO (Gallium Zinc Oxide), IZO (Indium Zinc Oxide), ITO (Indium Tin Oxide), FTO (Fluorine Tin Oxide), and the like.

The upper electrode layer 4 may be formed by a sputtering method, a vapor deposition method, a chemical vapor deposition (CVD) method or the like. It is sufficient that the thickness of the upper electrode layer 4 is set in a range from 0.05 μm or more to 3 μm or less. In the case when the upper electrode layer 4 has, for example, a resistivity of less than $1\Omega \cdot cm$ and a sheet resistance of $50 \, \Omega/sq$ or less, a charge can be successfully extracted from the photoelectric conversion layer 3 through the upper electrode layer 4.

In the case when the buffer layer 32 and the upper electrode layer 4 have a characteristic that easily transmits light (referred to also as "optical transparency") with respect to light wavelength bands that can be absorbed by the light absorption layer 31, the degradation of the light absorbing efficiency in the light absorption layer 31 can be prevented.

Moreover, when the thickness of the upper electrode layer 4 is set to 0.05 μm or more to 0.5 μm or less, the optical transparency of the upper electrode layer 4 can be enhanced, and an electric current generated by photoelectric conversion can be successfully transmitted. Furthermore, in the case when the absolute refractive index of the upper electrode layer 4 and the absolute refractive index of the buffer layer 32 are made virtually identical to each other, it becomes possible to reduce loss of incident light caused by reflected light on the interface between the upper electrode layer 4 and the buffer layer 32.

A grid electrode 5 is a conductive linear electrode portion placed on a main surface (referred to also as one main surface) on the +Z side of the upper electrode layer 4. This grid electrode 5 is provided with a plurality of collector portions 5a and a coupling portion 5b. The plural collector portions 5a are spaced from each other in the Y-axis direction, and each of them is extended in the X-axis direction. The coupling portion 5b is connected to each of the collector portions 5a, and each of them is extended in the Y-axis direction. As a material for the grid electrode 5, for example, metal, such as Ag, may be used. The metal contained in the grid electrode 5 may be, for example, Cu, Al, Ni, or the like.

The collector portions 5a collect charges that are generated by the photoelectric conversion layer 3 and then taken out by the upper electrode layer 4. When the collector portions 5a are installed, the upper electrode layer 4 can be made thinner. Since the upper electrode layer 4 is disposed on an upper (+Z side) portion of the light absorption layer 31, the optical transparency of the upper electrode layer 4 can be improved by making the upper electrode layer 4 as thin as possible. In this case, however, the upper electrode layer 4 has a greater resistivity as the thickness of the upper electrode layer 4 is made as thin as possible, resulting in a reduction in taking-out efficiency of the charge. Therefore, by disposing the collector portions 5a, the taking-out efficiency of the charge can be maintained so that it becomes possible to improve the optical transparency by making the thickness of the electrode layer 4 thinner.

The charge collected by the grip electrode 5 and the upper electrode layer 4 is transmitted to an adjacent photoelectric conversion cell 10 through a connection portion 45 placed in a second groove portion P2. The connection portion 45 is provided with an extended portion 4a of the upper electrode layer 4 and a suspending portion 5c from the coupling portion 5b formed thereon. Thus, in the photoelectric conversion device 21, a lower electrode layer 2 of one of the adjacent photoelectric cells 10 and an upper electrode layer 4 as well as a grid electrode 5 of the other photoelectric cell 10 are electrically connected in series with one another by the connection portion 45 formed in the second groove portion P2.

In the case when the width of the grid electrode 5 is set in a range from 50 μm or more to 400 μm or less, it is possible to prevent a reduction in the light receiving area that causes variations in the quantity of incident light to the light absorption layer 31 while a good conductivity is being maintained.

Additionally, of the grip electrode 5, at least the surface of each coupling portion 5b can be formed by using, for example, a material that reflects light having wavelength bands to be absorbed by the light absorption layer 31. In this case, when the photoelectric conversion device 21 is assembled into a module, light reflected by each coupling portion 5b can be again reflected inside this module so as to be again made incident on the light absorption layer 31. With this arrangement, the quantity of incident light to the light absorption layer 31 is increased so that the conversion efficiency of the photoelectric conversion device 21 can be improved. In order to form such a surface, for example, a paste formed by adding metal particles such as Ag having high light reflectance to a resin having a high optical transparency is applied on one main surface of the upper electrode layer 4, and the paste is then solidified by the succeeding drying process so that a grip electrode 5 may be formed. Moreover, for example, a metal having a high light reflectance such as Al may be vapor-deposited on the surface of the grid electrode 5.

(2) Method for Manufacturing Photoelectric Conversion Device

Figure 2:
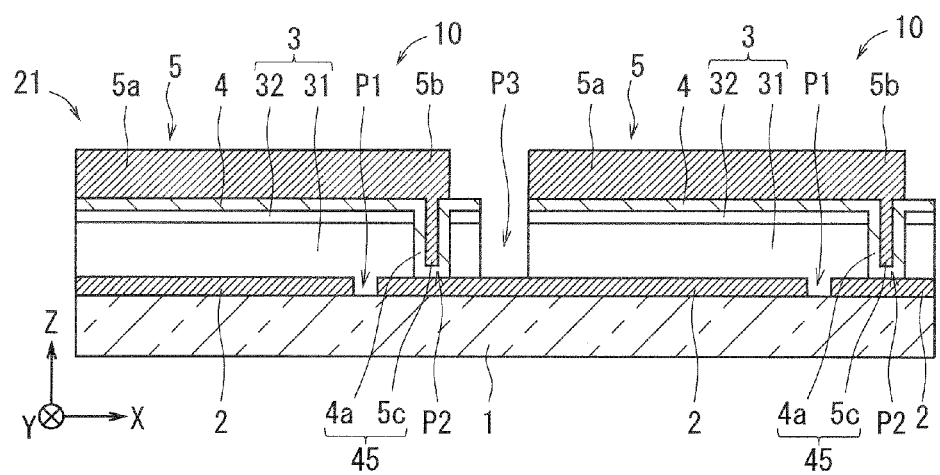
FIG. 2 is a schematic view showing a cross section of the photoelectric conversion device taken along a cross-sectional line II-II of FIG. 1.

Each of cross-sectional views shown in FIGS. 4 to 9 indicates a state in the middle of a manufacturing process of a portion corresponding to the cross sections of a photoelectric conversion device 21 shown in FIG. 2.

Figure 4:
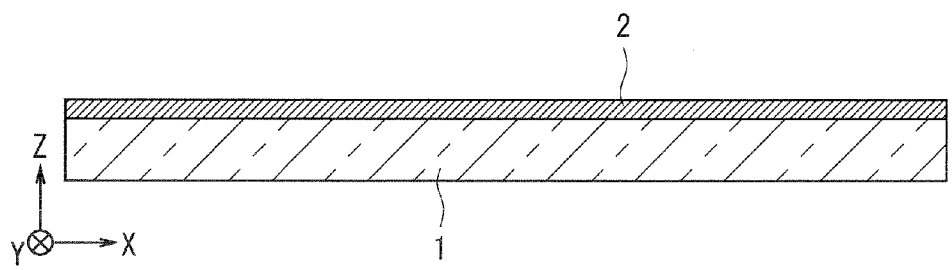
FIG. 4 is a cross-sectional view that schematically shows a state in the middle of manufacturing processes of a photoelectric conversion device.
Figure 5:
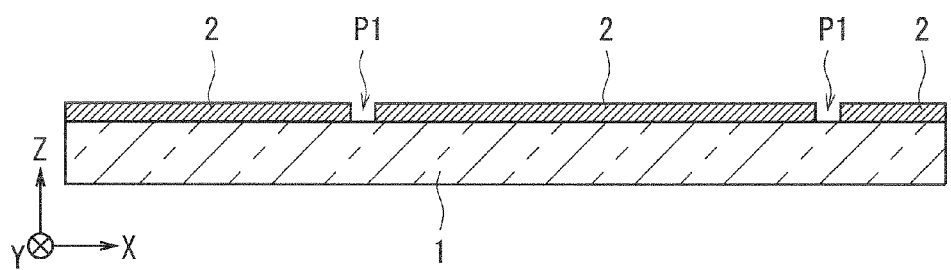
FIG. 5 is a cross-sectional view that schematically shows a state in the middle of manufacturing processes of the photoelectric conversion device.

First, as shown in FIG. 4, a lower electrode layer 2 mainly containing Mo or the like is formed by using a sputtering method or the like on virtually the entire surface of a substrate 1 that has been washed. Moreover, a first groove portion P1 is formed from a linear formation subject position along a Y-direction on the upper surface of the lower electrode layer 2 toward the upper surface of the substrate 1 directly beneath the formation subject position. The first groove portion P1 may be formed by irradiating the formation subject position with a laser light beam while being scanned by using, for example, a YAG laser, or the like. FIG. 5 is a view that shows a state after the formation of the first groove portion P1.

Figure 6:
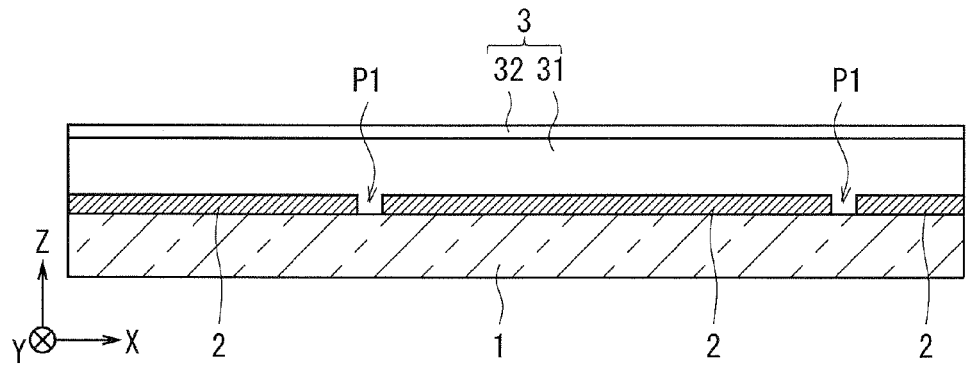
FIG. 6 is a cross-sectional view that schematically shows a state in the middle of manufacturing processes of the photoelectric conversion device.

After the formation of the first groove portion P1, a light absorption layer 31 and a buffer layer 32 are successively formed on the lower electrode layer 2. FIG. 6 is a view that shows a state after the formation of the light absorption layer 31 and the buffer layer 32.

Upon forming the light absorption layer 31, first, a semiconductor forming solution for use in forming the light absorption layer 31 is prepared. This semiconductor forming solution contains a metal element (referred to also as "material metal element") serving as a raw material used for forming the light absorption layer 31, an organic compound containing a chalcogen element (referred to also as a chalcogen element-containing organic compound), and a Lewis base organic compound. The material metal element is a metal element contained in a I-III-VI group compound semiconductor. Examples of the material metal element include a I-B group element and a III-B group element.

The chalcogen element-containing organic compound refers to an organic compound containing a chalcogen element. The chalcogen elements include S, Se and Te of VI-B group elements. In the case when Se is adopted as the chalcogen element, as the chalcogen element-containing organic compound, for example, selenol, selenide, diselenide, selenoxide, selenone, or the like may be adopted.

The Lewis base organic compound is an organic compound including a functional group that can be formed into a Lewis base. As the functional group that can be formed into a Lewis base, a functional group provided with a V-B group element (referred to also as 15 group element) including an unshared electron pair, a functional group provided with a VI-B group element including an unshared electron pair, and the like can be adopted. Specific examples of these functional groups include: an amino group (any of primary to tertiary amines), a carbonyl group, a cyano group, and the like. Specific examples of the Lewis base organic compound include: pyridine, aniline, triphenylphosphine, 2,4-pentanedione, 2-methyl-2,4-pentanedione, triethylamine, triethanol amine, acetonitrile, benzyl, benzoin, etc., and derivatives thereof.

The above-mentioned semiconductor forming solution is produced, for example, by successively carrying out the following processes [A] to [D]:

[A] Preparation of First Complex Solution:

By dissolving a Lewis base organic compound (referred to also as "first Lewis base organic compound") and an organic metal complex (referred to also as "first organic metal complex") containing a I-B group element in an organic solvent (referred to also as "first organic solvent"), a solution containing a first complex (referred to also as "first complex solution") can be prepared. At this time, a stirring process is carried out, and the first complex is generated by a reaction between the first Lewis base organic compound and the first organic metal complex.

Here, as the first Lewis base organic compound, for example, an organic compound or the like containing a V-B group element (referred to also as "15 group element"), such as $P(C_6H_5)_3$, $As(C_6H_5)_3$ and $N(C_6H_5)_3$, can be adopted. The first organic metal complex can be generated, for example, by dissolving a metal salt (referred to also as "first metal salt") of a I-B group element, such as CuCl, $CuCl_2$, CuBr and CuI, in an organic solvent, such as acetonitrile ($CH_3CN$). At this time, for example, an organic metal complex of a I-B group element (for example, $Cu(CH_3CN)_4 \cdot PF_6$, or the like) can be generated as the first organic metal complex. As the first organic solvent, for example, acetonitrile, acetone, methanol, ethanol, isopropanol, etc. may be adopted.

Supposing that the first Lewis base organic compound is represented by L and that the first organic metal complex is represented by $[M'R'_m]^+(X)^-$, the first complex is represented by $[L_nM'R'_{(m-n)}]^+(X')^-$. Here, M' represents a I-B group element, R' represents an arbitrary organic ligand, $(X')^-$ represents an arbitrary negative ion. For example, supposing that L is $P(C_6H_5)_3$ and that $[M'R'_m]^+(X')^-$ is $Cu(CH_3CN)_4 \cdot PF_6$, $[L_nM'R'_{(m-n)}]^+(X')^-$ represents $[P(C_6H_5)_3]_2Cu(CH_3CN)_2 \cdot PF_6$.

[B] Preparation of Second Complex Solution:

After a metal alkoxide and an organic compound containing a chalcogen element (referred to also as "first chalcogen element-containing compound") have been dissolved in an organic solvent (referred to also as "second organic solvent"), a raw material of a III-B group element is dissolved therein so that a solution containing a second complex (referred to also as "second complex solution) is prepared. At this time, a stirring process is carried out, and a metal salt (referred to also as "second metal salt") of the first chalcogen element-containing organic compound is generated by a reaction between the metal alkoxide and the first chalcogen element-containing organic compound. Moreover, at this time, a second complex is generated by a reaction between the second metal salt and the raw material of a III-B group element.

Here, the metal alkoxide is a material formed by combining a metal element, oxygen and an alkyl group with one another. As the metal alkoxide, for example, $NaOCH_3$ or the like may be adopted. As the first chalcogen element-containing organic compound, for example, thiol, selenol, tellurol, or the like may be adopted. In thiol, selenol and tellurol, for example, a chalcogen element is combined with an organic compound such as an acrylic, allyl, alkyl, vinyl, perfluoro or carbamate. As the second organic solvent, for example, methanol, ethanol, propanol and the like may be adopted. As the raw material of the III-B group element, a metal salt (third metal salt), such as $InCl_3$ and $GaCl_3$, may be adopted.

Supposing that the chalcogen element is represented by E, that the second metal salt is represented by A(ER") and that the third metal salt is represented by $M''(X'')_3$, the second complex is represented by $A^+[M''(ER'')_4]^-$. Here, R" represents an organic compound, A represents an arbitrary positive ion, M" represents a III-B group element and X" represents an arbitrary negative ion. For example, supposing that A(ER") is $NaSeC_6H_5$ and that $M''(X'')_3$ is $InCl_3$, $A^+[M''(ER'')_4]^-$ is $Na^+[In(SeC_6H_5)_4]^-$. Moreover, for example, supposing that A(ER") is $NaSeC_6H_5$ and that $M''(X'')_3$ is $GaCl_3$, $A^+[M''(ER'')_4]^-$ is $Na^+[Ga(SeC_6H_5)_4]^-$.

In this case, the second complex solution may contain a plurality of kinds of III-B group elements (for example, both of In and Ga). The second complex solution may be prepared by a method in which the third metal salt is formed as a mixture of metal salts of a plurality of kinds of III-B group elements, or a method in which the second complex solutions each of which contains one kind of III-B group element, and is produced for each of III-B group elements, are mixed with one another.

[C] Production of Precipitate Containing Single Source Precursor:

The first complex solution and the second complex solution, prepared by the above-mentioned processes [A] and [B], are mixed, and the first complex solution and the second complex solution are subsequently allowed to react with each other so that a precipitate containing a precursor (referred to also as "single source precursor") is produced. This precursor contains a I-B group element such as Cu or the like, III-B group elements such as In, Ga and the like, and a chalcogen element such as Se or the like. Additionally, upon allowing the first complex solution and the second complex solution to react with each other, it is sufficient that the temperature is set in a range from 0° C. or more to 30° C. or less, and it is sufficient that the reaction time is set in a range from 1 hour or more to 5 hours or less.

In this case, by the reaction between the first complex solution indicated by $[L_nM'R'_{(m-n)}]^+(X')^-$ and the second complex solution indicated by $A^+[M''(ER'')_4]^-$, a single source precursor indicated by $[L_nM'(ER'')_2M''(ER'')_2]^+$ is generated. For example, supposing that $[L_nM'R'_{(m-n)}]^+(X')^-$ is $[P(C_6H_5)_3]_2Cu(CH_3CN)_2 \cdot PF_6$ and that $A^+[M''(ER'')_4]^-$ is $Na^+[M''(SeC_6H_5)_4]^-$, $[L_nM'(ER'')_2M''(ER'')_2]^+$ is prepared as $[P(C_6H_5)_3]_2Cu(SeC_6H_5)_2M''(SeC_6H_5)_2$. In this case, M" is In and/or Ga.

Moreover, the solution in which the precipitate containing a single source precursor has been generated is separated into the precipitate and a solution portion above the precipitate. Furthermore, after the solution portion has been drained, the precipitate in a half-dried state is dried so that a precipitate containing the single source precursor can be obtained. Upon extracting the precipitate, centrifugal separation, filtration or the like of at least one time is carried out so that impurities, such as Na, Cl and the like, can be removed.

[D] Preparation of Semiconductor Forming Solution:

By adding an organic solvent (for example, pyridine or the like) to the precipitate of the single source precursor obtained in the process [C], a solution in which the concentration of the single source precursor has a predetermined value (for example, 5 to 50% by mass) is prepared. To this solution, a compound (for example, $Ga_2Se_3$ powder or the like) of a III-B group element and selenium is added so as to have a concentration of, for example, 1 to 10% by mass relative to the total weight of the single source precursor, and dissolved therein so that a semiconductor forming solution is prepared.

Additionally, a semiconductor forming solution may be prepared in which by dissolving the precipitate of the single source precursor in the third complex solution (solution containing the third complex), the ratios of contents among the I-B group element, III-B group element and VI-B group element are desirably adjusted. The third complex solution is generated by dissolving a III-B group element (for example, metal indium or the like) in a mixed solution of a Lewis base organic compound (for example, pyridine, or the like) and a chalcogen element-containing organic compound (for example, $HSeC_6H_5$, or the like).

Next, after the semiconductor forming solution has been applied onto one main surface of the lower electrode layer 2, the resulting layer is dried so that a coat (referred to also as "precursor layer") serving as a precursor of the light absorption layer 31 can be formed thereon. Thereafter, the precursor layer is subjected to a heat treatment so that the light absorption layer 31 is formed. As the coating method for the semiconductor forming solution, for example, a spin coating, screen printing, dipping, spraying or die coating method may be adopted.

It is sufficient that the drying process for forming the precursor layer is carried out, for example, in an inert gas atmosphere or a reducing gas atmosphere. It is sufficient that the drying temperature is set, for example, in a range of 50° C. or more to 300° C. or less. With respect to the atmosphere in which the heat treatment is carried out on the precursor layer, for example, any one of atmospheres including a nitrogen gas atmosphere, a hydrogen gas atmosphere, a mixed atmosphere of hydrogen and nitrogen, and a mixed atmosphere of hydrogen and argon is used. A gas containing a chalcogen element may be contained in the atmosphere for use in the heat treatment of the precursor layer. In this case, the formation of the I-III-VI group compound semiconductor can be accelerated.

In the heat treatment onto the precursor layer, after a heating process for maintaining the layer at a temperature range of 100° C. or more to 400° C. or less for a predetermined period of time so that a I-III-VI group compound semiconductor has been formed (crystallized), a cooling process (natural cooling) may be carried out by natural convection. It is sufficient that the predetermined period of time is set so as to maintain time required for forming the I-III-VI group compound semiconductor in accordance with the maintaining temperature.

In this heat treatment, the precursor layer is maintained at a comparatively low temperature, and the metal complex contained in the precursor layer is fused and brought into a liquid state so that an organic component of the metal complex is gradually transpired. At this time, the I-B group element having a relatively smaller solubility than those of the other elements (III-B group element and IV-B group element) in the liquid-state metal complex is allowed to move to the one main surface side of the lower electrode layer 2, and preferentially deposited thereon. As a result, a connection layer 31$b$, which has such a tendency that, as it comes closer to the one main surface of the lower electrode layer 2, a quotient obtained by dividing an amount of substance of the I-B group element by an amount of substance of the III-B group element becomes greater, is formed. At this time, a light absorption layer 31, which includes the connection layer 31$b$ and the main layer 31$a$, and mainly contains a I-III-IV group compound semiconductor, is formed.

The buffer layer 32 may be formed by a chemical bath deposition method (CBD method). For example, by immersing a substrate 1 with layers up to the light absorption layer 31 being formed thereon into a solution prepared by dissolving cadmium acetate and thiourea in ammonia water, a buffer layer 32 mainly containing CdS can be formed.

Figure 7:
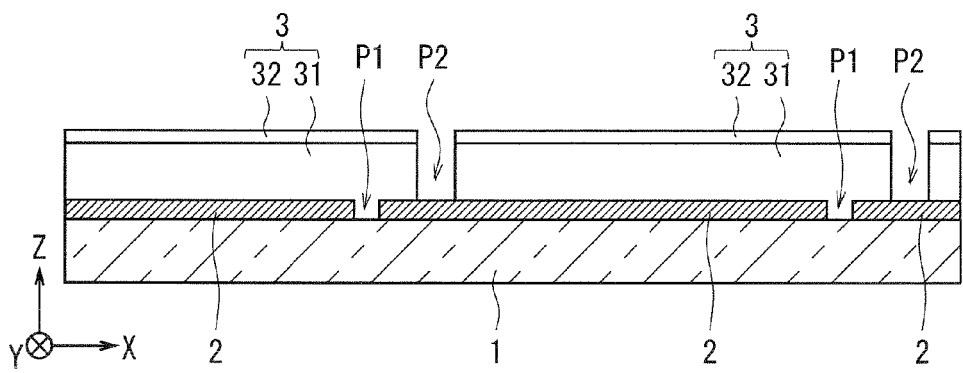
FIG. 7 is a cross-sectional view that schematically shows a state in the middle of manufacturing processes of the photoelectric conversion device.

After the light absorption layer 31 and the buffer layer 32 have been formed, a second groove portions P2 is formed from a linear formation subject position along a Y-direction on the upper surface of the buffer layer 32 toward the upper surface of the lower electrode layer 2 directly beneath the formation subject position. The second groove portion P2 is formed by continuously carrying out scribing processes using a scribe needle with a scribing width, for example, in a range about from 40 μm or more to 50 μm or less a plurality of times, while the subject position is being shifted. Moreover, the second groove portion P2 may be formed by carrying out scribing processes using a scribe needle, with its tip shape being expanded to such a degree as to be close to the width of the second groove P2. Alternatively, by carrying out scribing processes from one time to several times, with two or more scribe needles being mutually in contact with one another or mutually brought close to one another, and fixed, the second groove portion P2 may be formed. FIG. 7 is a drawing that illustrates a state after the second groove portions P2 have been formed. The second groove portion P2 is formed at a position slightly deviated from the first groove portion P1 in the X-direction (in the +X direction in the drawing).

Figure 8:
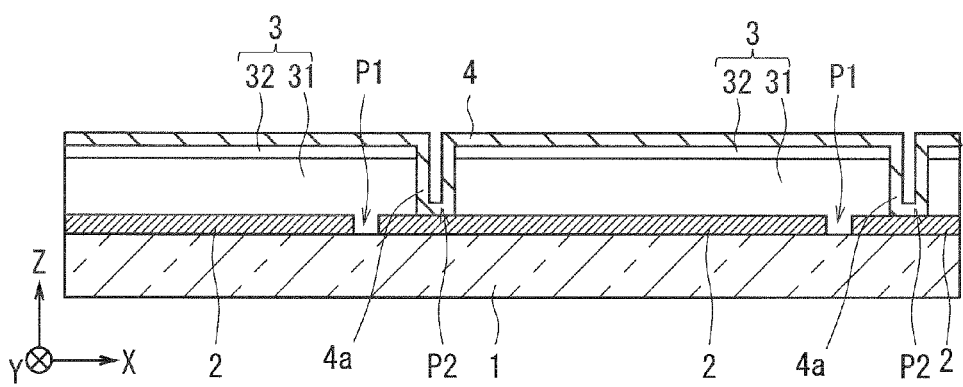
FIG. 8 is a cross-sectional view that schematically shows a state in the middle of manufacturing processes of the photoelectric conversion device.

After the second groove portion P2 has been formed, a transparent upper electrode layer 4 mainly comprised of, for example, ITO or the like is formed on the buffer layer 32. The upper electrode layer 4 may be formed by using a sputtering method, a vapor deposition method or a CVD method. FIG. 8 is a drawing that illustrates a state after the upper electrode layer 4 has been formed.

Figure 9:
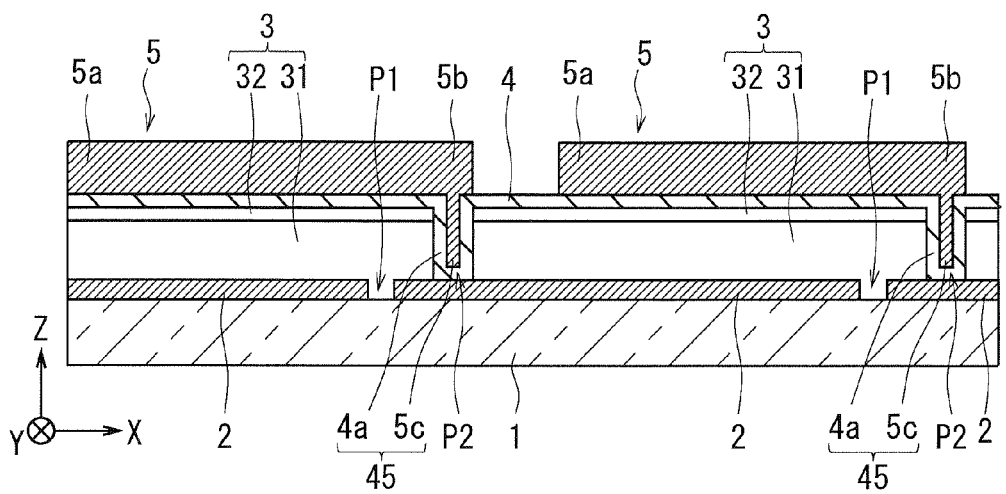
FIG. 9 is a cross-sectional view that schematically shows a state in the middle of manufacturing processes of the photoelectric conversion device.

After the upper electrode layer 4 has been formed, grid electrodes 5 are formed. For example, a paste having conductivity (referred to also as "conductive paste"), prepared by dispersing metal powder such as Ag or the like in a resin binder or the like is printed in a manner so as to draw a predetermined pattern, and by drying this to be solidified so that grid electrodes 5 are formed. Additionally, its solidified state includes both of a solidified state after a binder used for the conductive paste has been fused when the binder is prepared as a thermoplastic resin, and a cured state after the binder has been cured when the binder is prepared as a curable resin, such a thermosetting resin or a photo-curable resin. FIG. 9 is a drawing illustrating a state after the grid electrodes 5 have been formed.

After the grid electrodes 5 have been formed, a third groove portion P3 is formed from a linear formation subject position on the upper surface of the upper electrode layer 4 toward the upper surface of the lower electrode layer 2 directly beneath the formation subject position. Thus, the photoelectric conversion device 21 shown in FIGS. 1 and 2 is obtained. It is sufficient that the width of the third groove portion P3 is set to, for example, about 40 μm or more to 1000 μm or less. Moreover, the third groove portion P3 may be formed by using a mechanical scribing process, in the same manner as in the second groove portion P2.

(3) Specific Examples

Referring to specific examples, the following description will discuss the relationship between manufacturing conditions and the generation of the connection layer 31$b$ and improvements of the conversion efficiency of the photoelectric conversion device 21 by the connection layer 31$b$.

First, a semiconductor forming solution was prepared by successively carrying out the following steps [a] to [d].

[a] In 100 ml of acetonitrile were dissolved 10 mmol of $Cu(CH_3CN)_4 \cdot PF_6$ serving as an organic metal complex of a I-B group element and 20 mmol of $P(C_6H_5)_3$ serving as a Lewis base organic compound. At this time, a first complex solution was prepared by carrying out a stirring process of 5 hours at room temperature (for example, about 25° C.).

[b] To 300 ml of methanol were added 40 mmol of $NaOCH_3$ serving as a metal alkoxide and 40 mmol of $HSeC_6H_5$ serving as a chalcogen element-containing organic compound, and to this were further added 6 mmol of $InCl_3$ and 4 mmol of $GaCl_3$ to be dissolved therein. At this time, a second complex solution was prepared by carrying out a stirring process of 5 hours at room temperature.

[c] Into the first complex solution prepared in step [a] was dripped the second complex solution prepared in step [b] at a rate of 10 ml per minute, and a white deposit (precipitate) was generated. After the completion of this dripping process, a stirring process for 1 hour at room temperature and an extracting process of the precipitate by using a centrifugal separator were successively carried out. At the time of extracting the precipitate, a process in which the precipitate once taken out by a centrifugal separator was dispersed in 500 ml of methanol and the precipitate was again taken out by the centrifugal separator was repeated twice, and thereafter, the precipitate was dried at room temperature so that a precipitate containing a single source precursor was obtained. In this single source precursor, Cu, In and Se are contained in one complex molecule, or Cu, Ga and Se are contained therein.

[d] To the precipitate containing the single source precursor obtained in step [c] was added pyridine serving as an organic solvent so that a solution in which the single source precursor had a concentration of 45% by mass was produced. Thereafter, to this solution was added powder of $Ga_2Se_3$ so as to have a concentration of 7% by mass relative to the total amount of the single source precursor, and by dissolving the powder in the solution by carrying out a stirring process for 60 minutes at 80° C., a semiconductor forming solution was prepared.

Next, a member was prepared in which the lower electrode layer 2 mainly containing Mo or the like was formed on the surface of a substrate 1 mainly containing glass. After the semiconductor forming solution had been applied on the lower electrode layer 2 by using a blade method, a coat (precursor layer) was formed thereon by using a drying process for maintaining the member at 100° C. for 15 minutes. The precursor layer was formed by successively carrying out processes including the coating process by the blade method and the succeeding drying process twice. Thereafter, a heat treatment was carried out thereon under a mixed gas atmosphere of a hydrogen gas and a selenium vapor gas. In this heat treatment, the heating temperature was raised from the vicinity of room temperature to 400° C. in 5 minutes, and after having been kept at 400° C. for 2 hours, natural cooling was carried out so that a semiconductor layer mainly containing CIGS having a thickness of 1.4 µm was formed. This semiconductor layer corresponds to the light absorption layer 31.

Moreover, by changing the temperature and time of a heat treatment on the basis of the temperature and time required for the heat treatment at the time of forming the semiconductor layer as the example, a semiconductor layer of a comparative example was formed. More specifically, in the heat treatment in the comparative example, the temperature was raised from the vicinity of room temperature to 525° C. in 5 minutes, and after having been kept at 525° C. for 1 hour, natural cooling was carried out so that a semiconductor layer mainly containing CIGS having a thickness of 1.4 µm was formed.

By immersing a substrate 1 with layers up to the semiconductor layer being formed thereon of the example and a substrate 1 with layers up to the semiconductor layer being formed thereon of the comparative example into a solution prepared by dissolving zinc acetate and thiourea in ammonia water, a buffer layer mainly containing ZnS having a thickness of about 50 nm was formed on each of the semiconductor layers. Then, on the buffer layer, a transparent conductive film mainly containing ZnO doped with Al was formed by using a sputtering method. Lastly, grid electrodes containing Al were formed thereon by vapor deposition so that photoelectric conversion devices of the example and the comparative example were respectively formed.

With respect to the photoelectric conversion devices thus manufactured as the example and the comparative example, examinations were respectively carried out to find out whether or not the connection layer 31b existed in the semiconductor layer. These examinations were carried out by measurements and analyses using an X-ray photoelectron spectroscopy (XPS) when the semiconductor layer was formed in the manufacturing processes of the respective photoelectric conversion devices as the example and the comparative example. More specifically, an etching process and a measurement using the XPS were repeatedly carried out on the semiconductor layer, and changes in ratios (referred to also as "abundance ratio") of amounts of four kinds of elements (more specifically, Ga, In, Cu and Se) in the thickness direction were examined. Moreover, the conversion efficiency in the photoelectric conversion devices serving as the example and the comparative example was measured by using a so-called fixed light solar simulator, under conditions where the radiation intensity of light to the light receiving surface of the photoelectric conversion device was 100 mW/cm$^2$ and an AM (air mass) of 1.5.

Figure 10:
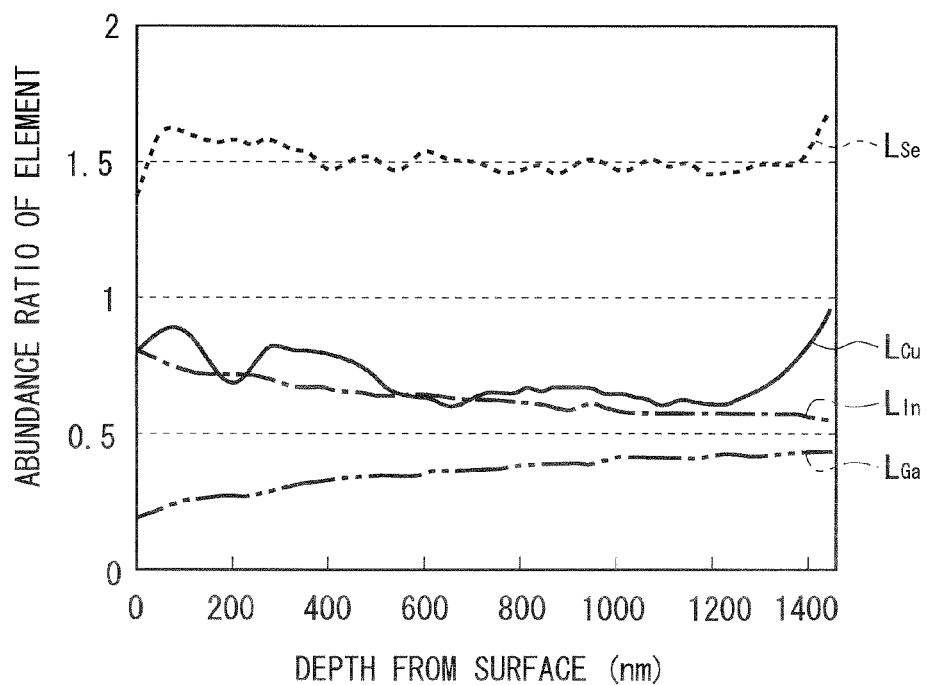
FIG. 10 is a view that shows a relationship between a depth and an abundance ratio of an element in a light absorption layer of an example.

FIG. 10 shows the results of examinations as to the presence or absence of the connection layer 31b with respect to the photoelectric conversion device of the example, and FIG. 11 shows the results of examinations as to the presence or absence of the connection layer 31b with respect to the photoelectric conversion device of the comparative example. Each of FIGS. 10 and 11 shows the relationship between the depth from the surface on the side where the buffer layer 32 was to be formed and ratios (abundance ratios) of amounts of substances relating to the four kinds of elements (Ga, In, Cu and Se) existing thereon by using curved lines, with respect to each of the semiconductor layers. More specifically, the total of the amounts of substances of III-B group elements (Ga and In) is set to 1, the abundance ratio of Ga is indicated by a curved line $L_{Ga}$ of a two-dot chain line, the abundance ratio of In is indicated by a curved line $L_{In}$ of a one-dot chain line, the abundance ratio of Cu is indicated by a curved line $L_{Cu}$ of a solid line, and the abundance ratio of Se is indicated by a curved line $L_{Se}$ of a broken line.

As shown in FIG. 11, in the semiconductor layer of the comparative example, the abundance ratios of any of the four kinds of elements (Ga, In, Cu and Se) are virtually constant regardless of the depth from the surface of the semiconductor layer. In contrast, as shown in FIG. 10, in the semiconductor layer of the example, within a range in which the depth from the surface exceeds 1200 nm, the abundance ratios of Cu and Se become higher as it comes closer to one main surface of the lower electrode layer 2. In the semiconductor layer of the example, the range in which the depth from the main surface exceeds 1200 nm is virtually coincident with a range in which a distance from the one main surface of the lower electrode layer 2 is 0 nm or more to 200 nm or less.

More specifically, in the semiconductor layer of the example, regardless of the depth from the surface of the semiconductor layer, the abundance ratio of Ga and In was virtually constant. Moreover, of the semiconductor layer of the example, within the region having a depth from the surface within 1200 nm, the abundance ratio of Cu and Se is virtually constant. In contrast, of the semiconductor layer of the example, within the region having a depth from the surface exceeding 1200 nm, the abundance ratio of Cu and Se becomes higher as it comes closer to the one main surface of the lower electrode layer 2.

In other words, it was confirmed that in the semiconductor layer of the comparative example, no connection layer 31b was present, and that in the semiconductor layer of the example, the connection layer 31b was present. With respect to the connection layer 31b, when analyses were carried out thereon by using XPS, XRD, SEM-EDS and TEM-EDS, existences of compounds such as CIGS, $Cu_2Se$ and CuSe were confirmed. Moreover, the conversion efficiency of the photoelectric conversion device serving as the comparative example was 8.83%, while the conversion efficiency of the photoelectric conversion device serving as the example was 10.24%.

Based upon the results of examinations and results of measurements as described above, it was confirmed that when a semiconductor layer corresponding to a light absorption layer was formed by a heat treatment carried out at a comparatively low temperature, the connection layer 31b was formed. Moreover, it was confirmed that by the existence of the connection layer 31*b*, the conversion efficiency of the photoelectric conversion device was improved.

(4) Modified Example

Additionally, the present invention is not intended to be limited to the above embodiments, and various changes, modifications, etc. may be made within the scope not departing from the gist of the present invention.

In the above-mentioned embodiment, by adjusting a heat treatment temperature at the time of forming a semiconductor layer corresponding to a light absorption layer, a connection layer 31*b* is formed; however, the present invention is not limited to this. For example, another aspect may be used in which a precursor layer having abundance ratios (concentrations) among a I-B group element, a III-B group element and a VI-B group element that are made different in the depth direction is formed by using, for example, a sputtering method or a solution coating method so that the connection layer 31*b* is formed. In this aspect, by the heat treatment applied to the precursor layer, crystallization of the I-III-VI group compound proceeds so that a semiconductor layer including a connection layer 31*b* can be formed.

These changes in the abundance ratios may be achieved by either an increase in the amount of substance of the I-B group element or a reduction in the amount of substance of the III-B group element. Additionally, the VI-B group element can be supplied to the precursor layer from an ambient atmosphere at the heat treatment. For this reason, the VI-B group element may be preliminarily contained in the precursor layer before the heat treatment, or does not have to be preliminarily contained in the precursor layer, prior to the heat treatment.

In the above-mentioned embodiment, a substance having a comparatively high conductivity that exists in the connection layer 31*b* is a compound of copper and selenium that is a I-VI group compound ($Cu_2Se$ and $CuSe$); however, the present invention is not intended to be limited to this. For example, the I-VI group compound may be prepared as a compound of copper and sulfur, or a compound of silver and selenium, or a compound of silver and sulfur. Moreover, even in the case when a simple substance of a I-B group element such as Cu or the like exists in the connection layer 31*b*, it is possible to improve the conductivity of the connection layer 31*b*.

In the above-mentioned embodiment, there has been mainly explained the case in which CIGS is adopted as the I-III-VI group compound mainly contained in the light absorption layer 31; however, the present invention is not intended to be limited to this. For example, the I-III-VI group compound may have another composition, such as CIS, CIGSS or the like. In this case also, as long as the I-B group element such as Cu exists in either a compound mode (I-VI group compound) with a VI-B group element or a simple substance mode in the connection layer 31*b*, the conversion efficiency of the photoelectric conversion device can be improved.

Moreover, the above-mentioned embodiment is provided with the buffer layer 32; however, the present invention is not intended to be limited to this. For example, even in the case of a photoelectric conversion device including no buffer layer 32 formed therein, the conversion efficiency of the photoelectric conversion device can be improved by the existence of the connection layer 31*b*.

Additionally, it is needless to say that the entire portions or one portion of the structures forming the above-mentioned embodiment and various modified examples may be appropriately combined with one another within a range without causing any inconsistency.

REFERENCE NUMERALS

1 Substrate
2 Lower electrode layer
3 Photoelectric conversion layer
4 Upper electrode layer
5 Grid electrode
10 Photoelectric conversion cell
21 Photoelectric conversion device
31 Light absorption layer
31*a* Main layer
31*b* Connection layer
32 Buffer layer
45 Connection portion

The invention claimed is:
1. A method for manufacturing a photoelectric conversion device comprising:
   preparing a solution containing a Lewis base organic compound, an organic compound containing a chalcogen element, a I-B group element and a III-B group element;
   applying the solution onto one main surface of an electrode so as to form a coat containing the I-B group element and the III-B group element thereon; and
   heating the coat in a temperature range from 100° C. or more to 400° C. or less so as to form a semiconductor layer including a connection layer that is located on the one main surface side, and has a tendency that, the closer to the one main surface, the greater a quotient obtained by dividing an amount of substance of a I-B group element by an amount of substance of a III-B group element becomes, and containing a I-III-VI group compound semiconductor.

* * * * *